United States Patent
Joist

(10) Patent No.: US 6,916,190 B2
(45) Date of Patent: Jul. 12, 2005

(54) PLUG-IN MODULE FOR PLUGGING IN AND/OR PULLING OUT OF A MODULE RACK

(75) Inventor: Michael Joist, Gaggenau (DE)

(73) Assignee: Schroff GmbH, Straubenhardt (DE)

( * ) Notice: Subject to any disclaimer, the term of this patent is extended or adjusted under 35 U.S.C. 154(b) by 0 days.

(21) Appl. No.: 10/891,232

(22) Filed: Jul. 15, 2004

(65) Prior Publication Data

US 2005/0014403 A1 Jan. 20, 2005

(30) Foreign Application Priority Data

Jul. 18, 2003 (EP) .............................................. 03016291

(51) Int. Cl.$^7$ ............................................. H01R 13/62
(52) U.S. Cl. ...................................... 439/160; 361/732
(58) Field of Search ................................ 361/726, 732, 361/747, 759; 439/152, 157, 160

(56) References Cited

U.S. PATENT DOCUMENTS

| | | | | |
|---|---|---|---|---|
| 4,206,405 A | * | 6/1980 | Pentecost ..................... | 324/116 |
| 5,140,501 A | | 8/1992 | Takahashi et al. | |
| 5,309,325 A | * | 5/1994 | Dreher et al. ................ | 439/160 |
| 5,506,758 A | * | 4/1996 | Cromwell ..................... | 439/327 |
| 5,675,475 A | * | 10/1997 | Mazura et al. ............... | 439/157 |
| 5,793,614 A | * | 8/1998 | Tollbom ....................... | 439/160 |
| 6,160,717 A | * | 12/2000 | Desousa et al. ............. | 361/759 |
| 6,579,029 B1 | * | 6/2003 | Sevde et al. .............. | 403/322.3 |
| 6,762,934 B2 | * | 7/2004 | Kitchen et al. .............. | 361/727 |

FOREIGN PATENT DOCUMENTS

| | | |
|---|---|---|
| DE | 41 05 948 A1 | 8/1992 |
| WO | WO 96/42187 A1 | 12/1996 |

* cited by examiner

Primary Examiner—Briggitte R. Hammond
(74) Attorney, Agent, or Firm—Venable LLP; Robert Kinberg

(57) ABSTRACT

A plug-in module to be plugged in and/or pulled out of a module rack provided with at least one front stop edge, comprising a lever pull with handle arm and lever arm which is positioned pivoting in the frontal region of the plug-in module. A locking lever is attached articulated and such that it can rotate to the handle arm of lever pull. The locking lever turns an elastic locking tab. A corresponding locking profile is arranged in the frontal region of the plug-in module, wherein the locking tab engages behind the locking profile if the lever pull is pivoted out completely and thus prevents the lever pull from pivoting.

20 Claims, 10 Drawing Sheets

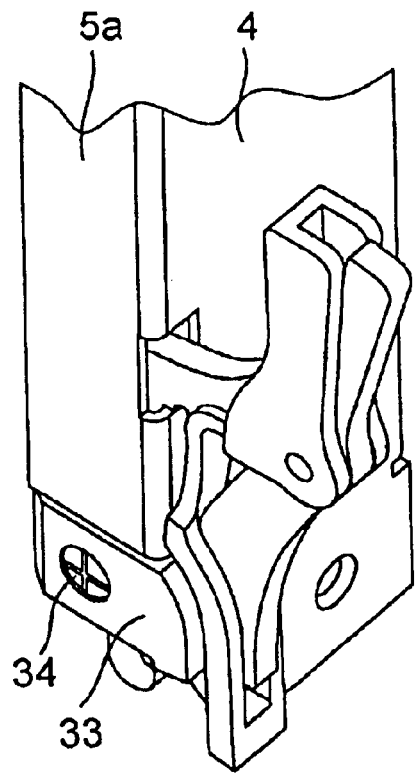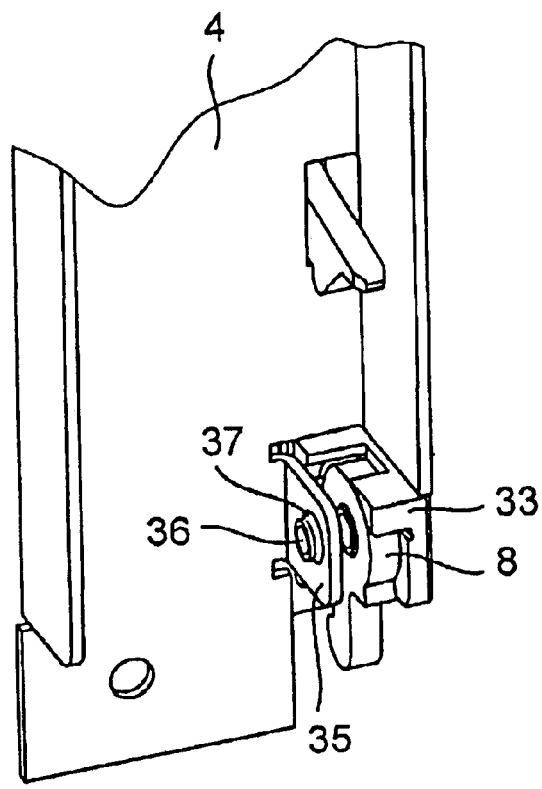
Fig. 7a    Fig. 7b
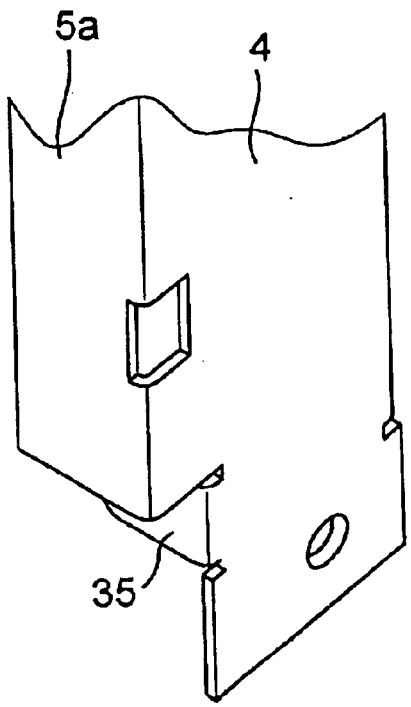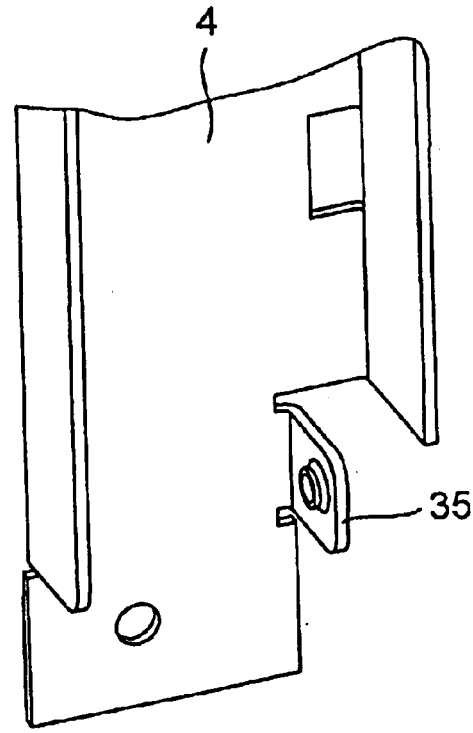
Fig. 8a    Fig. 8b

PLUG-IN MODULE FOR PLUGGING IN AND/OR PULLING OUT OF A MODULE RACK

CROSS-REFERENCE TO RELATED APPLICATION

This application claims the priority of European Patent Application No. 03 016 291.1, filed on Jul. 18, 2003, the subject matter of which is incorporated herein by reference.

BACKGROUND OF THE INVENTION

The invention relates to a plug-in module for plugging in and/or pulling out of a rack having at least one front stop edge. The plug-in module comprises a lever pull that is positioned pivoting in the front region of the plug-in module and is provided with a handle arm and a lever arm.

At the back end, plug-in modules are provided with a multi-pole connector which is plugged into a corresponding connector strip on the backplane of the module rack. Enormous forces are required for the connecting and disconnecting of the plug-in connection. For this, the plug-in modules are generally provided in the frontal region with a lower and an upper lever pull, designed for inserting the plug-in modules into and/or removing them from the module rack. At the beginning of the insertion by lever, the lever pulls must be pivoted out completely. The problem with the upper lever pull is that the long lever arm, designed as handle arm, drops down as a result of gravity, thus allowing the lever pull to pivot downward unintentionally. As a result, the lever pull obstructs the insertion of the plug-in module and the module cannot be plugged completely into the rack while the lever is in this position. The operator inserting the plug-in module must then intervene manually to move the lever pull to the respective position. The module can be inserted only after the lever pull is moved.

Prior art discloses several lever pulls that can be latched or locked in an end position.

A modular unit with a lever for inserting the module into a receptacle is known from reference DE 41 05 948 C2. A lever with handle is positioned pivoting on a long arm of the lever. An elastic latching means engages the lever once the module is completely inserted, wherein the lever is disengaged again by pivoting the lever handle. The latching means is suitable for locking the lever in the pivoted-in position. However, a securing of the lever in the completely pivoted-out end position is not planned and is also not possible with the proposed latching means.

Reference EP 0 832 547 B1 discloses the front portion of a module board with a corner piece to which a lever pull is attached which is provided with means for securing it. However, the lever pull can be secured in its respective end position only if the module board is completely inserted into the rack. No means are disclosed for securing the lever pull also in the pivoted-out state.

Lever pulls held in the pivoted-out position by means of an integrated spring are known in the prior art. In practical operations, however, springs of this type have proven unsuitable since they will become overextended and soft over time, thus no longer ensuring a reliable holding of the lever pull. During the insertion of the plug-in module into the module rack, the lever pull must be actuated manually to overcome the spring force. However, the operator frequently uses uncontrolled force to overcome the spring force and the lever pull is pivoted-in too early. The lever pull in that case prevents the plug-in module from being inserted. A complete inserting of the plug-in module into the rack is possible only after the lever pull has been pivoted out again, counter to the force of the spring.

SUMMARY OF THE INVENTION

Thus, it is the object of the present invention to create a plug-in module for which the lever pull in the completely pivoted-out position can be locked in place reliably with simple mechanical means, wherein it should be possible to release the locking easily and without problems during the insertion of the plug-in module into the rack.

To solve this object, we start with a plug-in module that can be plugged in and/or pulled out of a rack having at least one frontal stop edge. The plug-in module has a lever pull in the frontal region that is positioned pivoting and comprises a handle arm and a lever arm.

This object is solved according to the invention with a locking lever that is attached articulated and such that it can rotate to the handle arm of the lever pull and is provided with an elastic locking tab and a corresponding locking profile in the front region of the plug-in module, wherein the locking tab grips behind the locking profile if the lever pull is completely pivoted out, thus preventing the lever pull from pivoting. As soon as the lever pull is pivoted out completely, in particular when using it to remove the plug-in module from the module rack, the locking tab automatically grips behind the corresponding locking profile without manual intervention by the operator. The automatic locking is effected by the elastic design of the locking tab. The locking tab is held by the locking profile, so that the lever pull cannot be pivoted until they are disengaged. As a result, the lever pull is automatically placed in the starting position where the plug-in module can be inserted without problems into the rack. The operator in this case does not need to manually secure the lever pull during the insertion. The insertion therefore also cannot be hindered by a lever pull in the incorrect position. For the upper lever pull in particular this is advantageous since it would otherwise pivot downward by itself, solely as a result of gravity, and would prevent the insertion by lever of the plug-in module.

According to one preferred embodiment, the locking lever has a detent with attached locking tab, which is suitable for locking in place the completely pivoted-in lever pull. The detent functions to secure the completely pivoted-in lever pull in its respective end position. This is desirable in particular for plug-in modules that are inserted completely into the rack to avoid an unintended levering-out of the module. From a design and production point of view, it is advantageous if the locking tab is arranged on the detent. In that case, both elements for securing the lever pull form one unit.

The detent is advantageously provided with a detent nose, which can engage behind a detent edge in the frontal region of the plug-in module. The locking in place of the locking lever prevents an unintended or independent movement of the locking lever. The lever pull is thus secured against pivoting when the plug-in module is completely inserted, and the plug-in module can be pulled out of the rack only if the detent is released and the lever pull is unlocked. The detent is released by moving the detent nose out from behind the detent edge. The detent edge in the frontal region of the plug-in module can be arranged on a module board or on a separate corner piece.

The plug-in module preferably has a front panel provided with a recess, which forms the detent edge. The detent nose engages by projecting through the recess and engaging behind the detent edge. As soon as the detent projects through the recess in the front panel, the recess is for the most part closed off, thus preserving an important function of the front panel, namely to protect the components behind the front panel against damage and pollution. The front panel can also be provided with additional recesses at the lower end which provide recesses and reshape the lower region of the lever pull, thus ensuring that the front panel closes off the plug-in module nearly completely.

According to one particularly advantageous embodiment of the plug-in module, the detent activates a switch for the active/passive switching of the plug-in module once the plug-in module is completely inserted. In addition to locking the lever pull when the plug-in module is completely inserted and the lever pull is completely pivoted in, the plug-in module can also be switched from active to passive by activating a switch. This is particularly important for computer systems, so that only non current-carrying modules are removed from and/or inserted into the rack and the plug-in module is switched to the active state only after it is completely inserted. Interferences in the internal bus system are thus reliably prevented. Since the detent causes the activation of the switch, the switching of the module is coupled to the locking of the locking lever and/or the lever pull. It is thus impossible to remove a plug-in module in the non-passive state from the rack since the switch for the active/passive switching is automatically activated along with the unlocking operation. To ensure an optimum and reliable switching of the plug-in module, the shape of the detent that triggers the switching can be adapted to the switch, e.g. by having a switching surface or a trip cam at the exposed end of the detent.

According to a different advantageous embodiment of the plug-in module according to the invention, an activation element acts upon the locking tab. The activation element cooperates with the front stop edge of the rack, such that the lever pull is automatically released during the insertion of the plug-in module. As soon as the activation element comes in contact with the front stop edge during the insertion of the plug-in module into the rack, it pushes onto the locking tab which thus separates from the locking profile and releases the lever pull. As a result, the lever pull in the pivoted-out end position is unlocked, so that the insertion is not hindered by the pivoted-out lever pull. The automatic unlocking of the lever pull in the fully pivoted-out position occurs during the insertion of the plug-in module without manual operator intervention, thus optimizing the operator's handling ability.

The activation element can advantageously be embodied as extension of the locking tab and can rest with pre-tensioning against the lever arm of the lever pull. The locking tab is designed such that it automatically engages behind the locking profile once the pivoted-out end position is reached, wherein the pre-tensioning supports the locking of the lever pull in the pivoted-out end position. The pre-tensioning furthermore supports the locking in place of the fully pivoted-in lever pull once the plug-in module is inserted by pulling the detent nose elastically against the detent edge. To unlock the lever pull, the pre-tensioning of the activation element must be overcome, in the same way as for unlocking the lever pull in the pivoted-out position. An accidental locking or unlocking of the lever pull is thus impossible.

The activation element is preferably positioned on the lever arm such that it can be displaced in longitudinal direction, consequently making it very effective and resulting in a space-saving arrangement that requires the activation element to be moved only over a short distance. The force effect of the longitudinally displaceable activation element as well as the transfer are good, particularly during the unlocking operation, meaning when disengaging the locking tab from the locking profile. The displacement of the activation element in longitudinal direction in this case is translated into a rotational movement of the locking lever with respect to the lever pull.

It is particularly advantageous if the locking lever is provided with an activation arm. This activation arm allows the operator to manually move the locking lever, thus unlocking the completely pivoted-out lever pull and/or disengaging the pivoted-in lever pull. In addition to the unlocking of the lever pull, the activation arm also functions to grip the lever pull.

According to one particularly advantageous embodiment, the activation arm has a U-shaped cross section, wherein the handle arm of the lever pull can be pivoted between its U-shaped legs. The U-shaped activation arm in that case partially encircles the handle arm of the lever pull and guides it between its two U-shaped legs. As a result, the mobility of the locking lever is restricted to the forward-pull direction. The stability of the locking lever against side forces is increased. A turning of the locking lever against the lever pull is prevented by the U-shaped guide and the operator's handling ability is optimized. The U-shaped activation arm is clearly wider than the lever pull. The manual activation by the operator of the activation arm thus becomes more comfortable.

Alternatively, the handle arm of the lever pull can also have a U-shaped design. In that case, the activation arm would be guided between the U-shaped legs of the lever pull. With a design of this type, the activation arm of the locking lever could additionally be T-shaped, so that the T-shaped back could provide a broad support surface for a comfortable activation by the operator.

The U-shaped back of the activation arm is advantageously oriented toward the plug-in module, thus improving the operating comfort of the lever. During the operation, the operator pushes the activation arm of the locking lever against the handle arm of the lever pull. With a plug-in module that is completely inserted into the module rack, this relative movement of the locking lever effects the engagement and disengagement of the lever pull. As soon as the activation arm of the locking lever rests against the handle arm of the lever pull, the force exerted onto the activation arm is transmitted directly to the handle arm of the lever pull, thus starting the pivoting movement of the lever pull and the removal by lever of the plug-in module from the rack.

The plug-in module preferably is provided with a front panel that comprises an angled, essentially level side part. The corner region of the side part can be embodied as easy to produce locking profile. In addition, a locking profile realized in this manner has proven to be extraordinarily sturdy, particularly if the front panel is made of metal, and prevents wear caused by abrading or bending of the locking profile. The locking profile arranged on the side part is particularly effective for locking the lever pull if the side part also carries the bearing for the lever pull. In that case, the direct cooperation between the locking tab, arranged on the lever pull and thus also positioned on the side part, and the locking profile is ensured. Locking tab and locking profile can be matched precisely and without much play, wherein small tolerances are possible. A smooth interaction is thus ensured.

According to one advantageous embodiment, a special corner piece is provided in the corner region of the front panel on which the lever pull is positioned pivoting and which is embodied as locking profile. This corner piece is formed as a separate part and can be made from a different material than that used for the front panel of the plug-in module. A separate corner piece of this type is particularly advantageous if other levers are used or special levers are to be installed later on. Since the lever pull as well as the locking profile are always arranged on the corner piece, a direct effect occurs between both which ensures a reliable locking of the lever pull.

BRIEF DESCRIPTION OF THE DRAWINGS

In the following, an exemplary embodiment of the invention is explained with the aid of the enclosed Figures, which show in:

FIG. 3 A perspective representation of the locking lever shown in FIG. 1a.

FIG. 4 A perspective representation of the lever pull shown in FIG. 1a.

FIGS. 5a and 5b A perspective representation of the front corner region of the plug-in module shown in FIG. 1a.

FIGS. 7a and 7b An alternative embodiment of the lower corner region of a plug-in module with front panel and corner piece, shown in a perspective representation.

FIGS. 8a and 8b The front panel shown in FIG. 7a, by itself.

DETAILED DESCRIPTION OF THE INVENTION

FIGS. 1a to 1d clearly illustrate the operation of pulling a plug-in module 1 out of a module rack, wherein only the lower front stop edge 2 of the rack can be seen, which may take the form of a module rail and/or module bar.

Figure 1A:
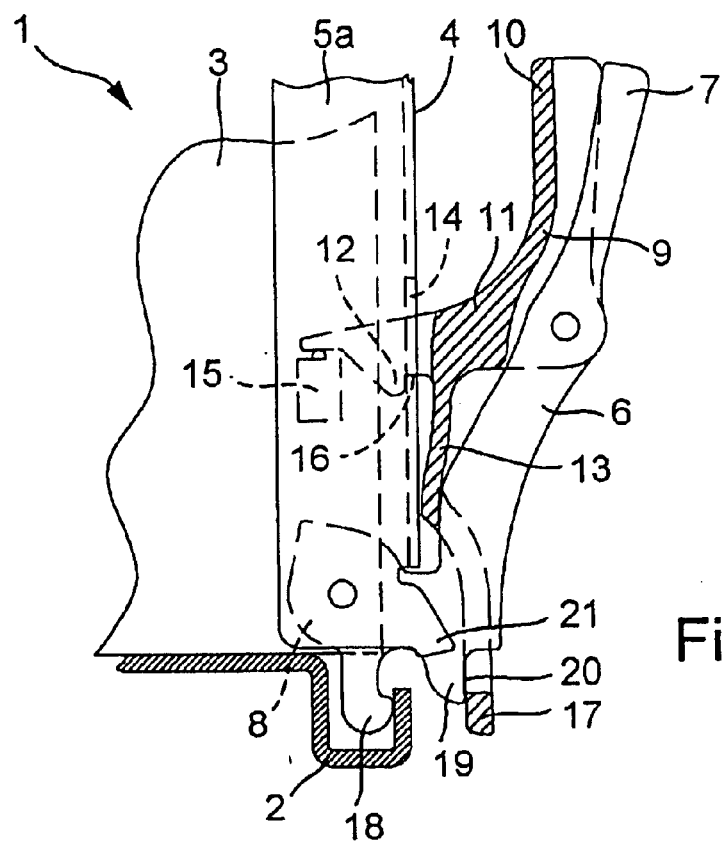
FIGS. 1a to 1e The frontal region of a plug-in module with lever pull and attached articulated locking lever, shown in different positions while the plug-in module is pulled out of a module rack, respectively shown as sectional view from the side.

FIG. 1a shows the plug-in module 1 in the position where it is completely inserted into the rack. The plug-in module 1 comprises a circuit board 3, a front panel 4 with angled side part 5a and a lever pull 6, arranged such that it can turn in the frontal region of the plug-in module 1. The lever pull 6 has a long, upward-extended handle arm 7 and a shorter lever arm 8.

A locking lever 9 is arranged such that it can turn on the handle arm 7. The locking lever 9 comprises an activation arm 10 and a detent 11, which is arranged approximately at a 90 degree angle to the activation arm 10. A detent nose 12 is formed onto the detent 11, wherein the detent 11 is also provided with a locking tab 13 that extends downward, approximately parallel to the front panel 4. If the plug-in module 1 is completely inserted into the rack, the detent 11 projects through a recess 14 in the front panel 4 and activates a switch 15, arranged behind the front panel 4, for the active/passive switching of the electronic circuit arranged on the plug-in module 1. The detent nose 12 of detent 11 in the process engages behind a detent edge 16 of the recess 14.

An activation element 17 is embodied as formed-on extension of the locking tab 13, in the shape of a skid pointing in downward direction. The free end of the activation element 17 projects in downward direction past the lever arm 8.

The lever arm 8 comprises a tail skid 18, which engages in the front stop edge 2 if the plug-in module 1 is fully inserted into the module rack, as well as a pressing shoulder 19 with a pressing surface 20 on the outside. The activation element 17 rests with pre-tensioning against this pressing surface 20.

The side part 5a on the front panel 4 is provided with a locking profile 21 on the lower end, which projects past the side part 5a toward the front.

Figure 1B:
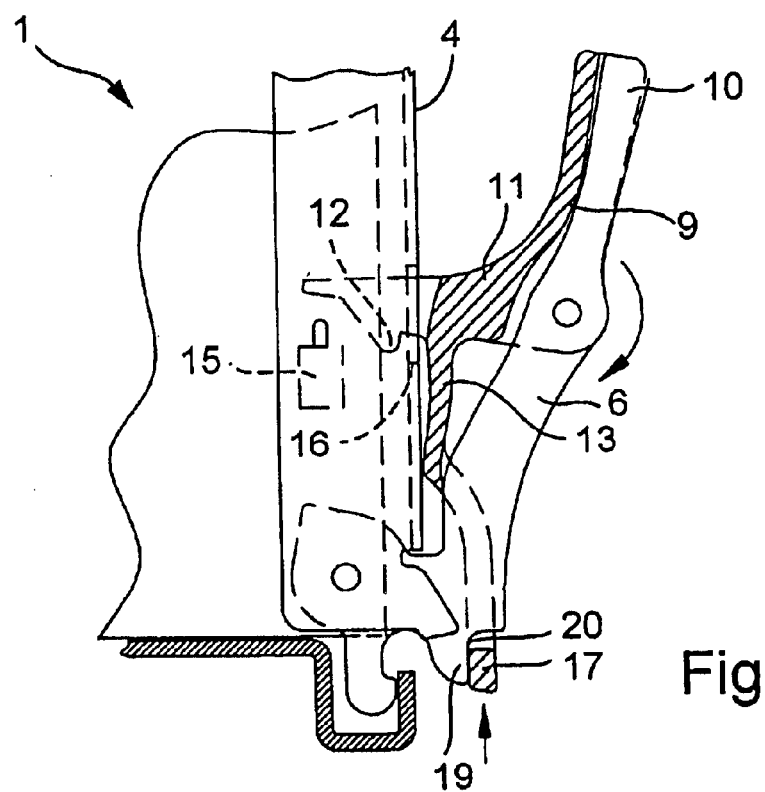
Figure 1C:
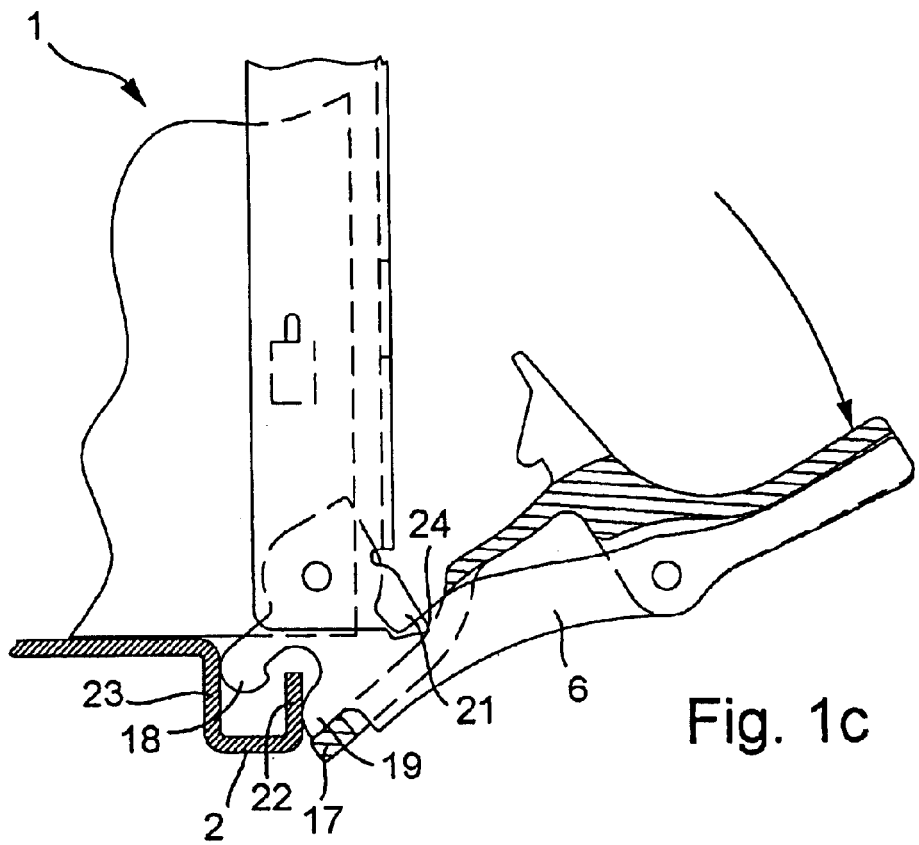

FIG. 1b shows the start of the operation for pulling the plug-in module 1 out of the rack. The locking lever 9 is pivoted in such a way that the activation arm 10 rests against the handle arm 7. As a result, the exposed end of detent 11 is raised, the detent nose 12 separates from the detent edge 16, thus disengaging the locking lever 9 and unlocking the lever pull 6. At the same time, the switch 15 is released so that the plug-in module 1 is switched to the passive state. The movement of detent 11 causes the locking tab 13 to move along the front panel 4 in upward direction.

The unlocked lever pull 6 can then be pivoted out in the direction of the arrow, thus causing the lever to remove the plug-in module 1 from the rack (FIG. 1c) The tail skid 18 acts upon an inside leg 23 of front stop edge 2. During the pivoting operation of lever pull 6, the activation element 17 rests against one corner 24 of the locking profile 21 and glides along this edge.

Figure 1D:
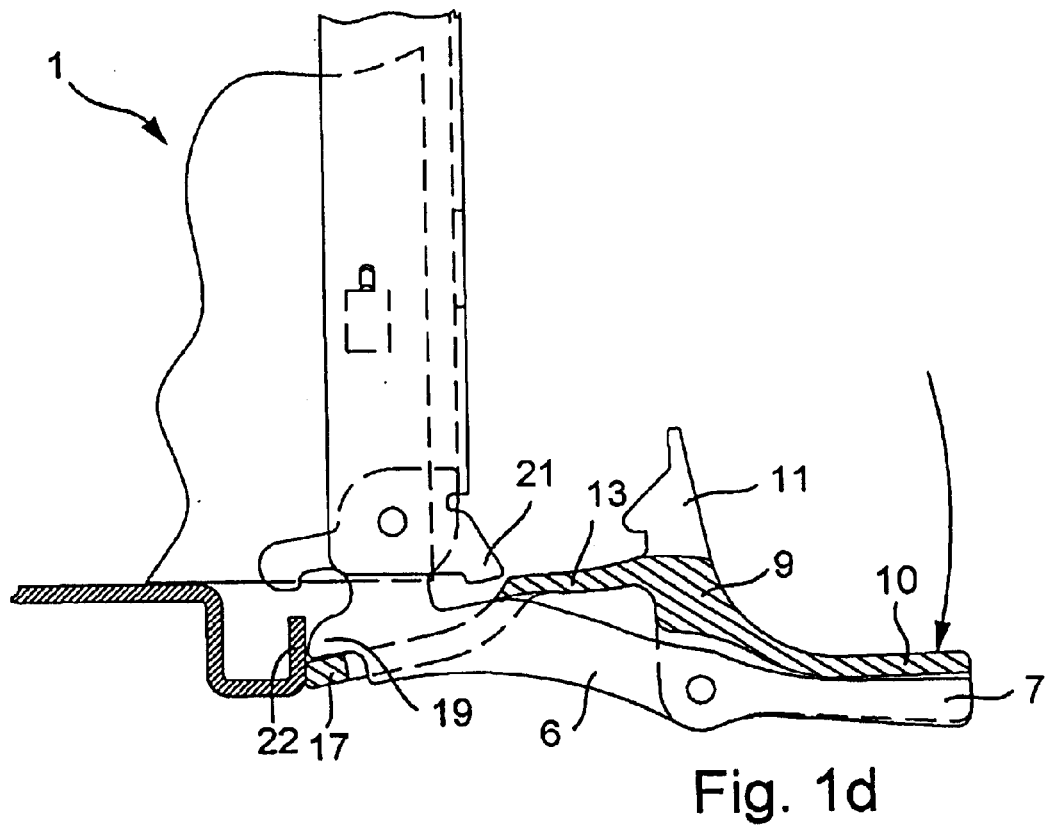

In FIG. 1d, the lever pull 6 is completely pivoted out and the pressing shoulder 19 rests against the outside leg 22 of front stop edge 2.

Since the activation arm 10 of locking lever 9 pushes against the handle arm 7 of lever pull 6, the locking tab 13 is displaced in the direction of detent 11, so that it no longer engages in the locking profile 21.

Figure 1E:
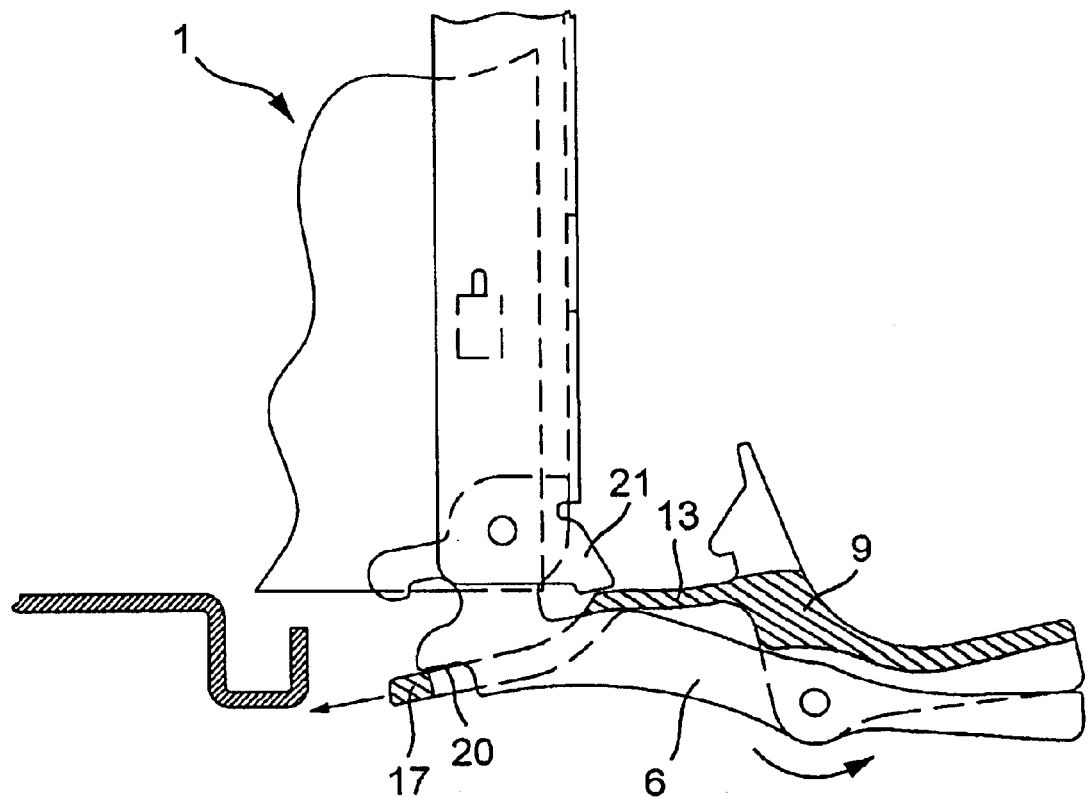

If the operator releases the activation arm 10, following the removal by lever of the plug-in module 1 from the rack, then the locking lever 9 returns to its idle position on the lever pull 6. At the end, the locking tab 13 engages behind the locking profile 21, thus preventing the lever pull 6 from pivoting. This position of the plug-in module 1 is shown in FIG. 1e and, at the same time, represents the starting position from which the plug-in module 1 can again be inserted by lever into the rack.

Figure 2A:
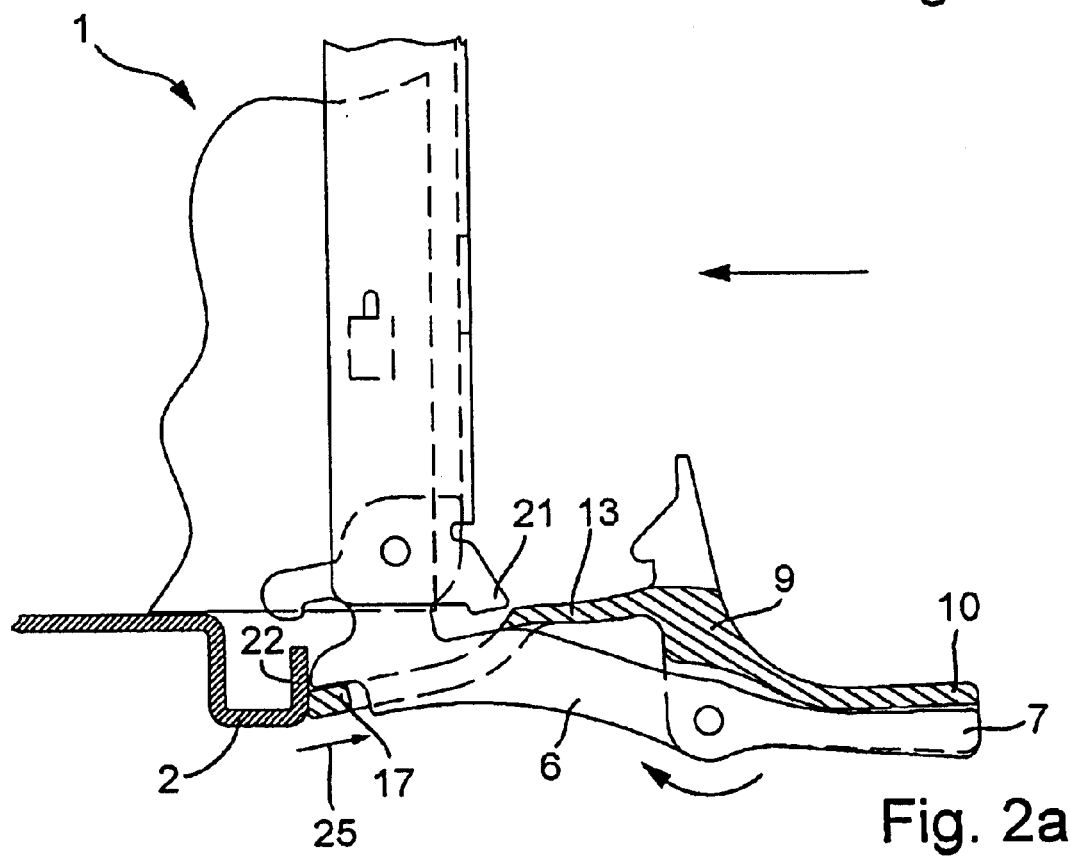
FIGS. 2a to 2e The frontal corner region of the plug-in module in different positions during the insertion by lever of the plug-in module into the rack, respectively as sectional view.

For inserting the plug-in module 1 with the aid of the lever, it is first pushed far enough into the rack until the activation element 17 hits the outside leg 22 of the front stop edge 2 of the module rack. During the further insertion of the plug-in module 1 according to FIG. 2a, the activation element 17 is pushed in arrow direction 25. The locking tab 13 is thus pushed along the locking profile 21 until the locking tab 13 and the locking profile 21 are disengaged. The lever pull 6 is thus unlocked and can be pivoted upward in the direction toward the front panel 4, so that the plug-in module 1 can be inserted with the aid of the lever.

Figure 2B:
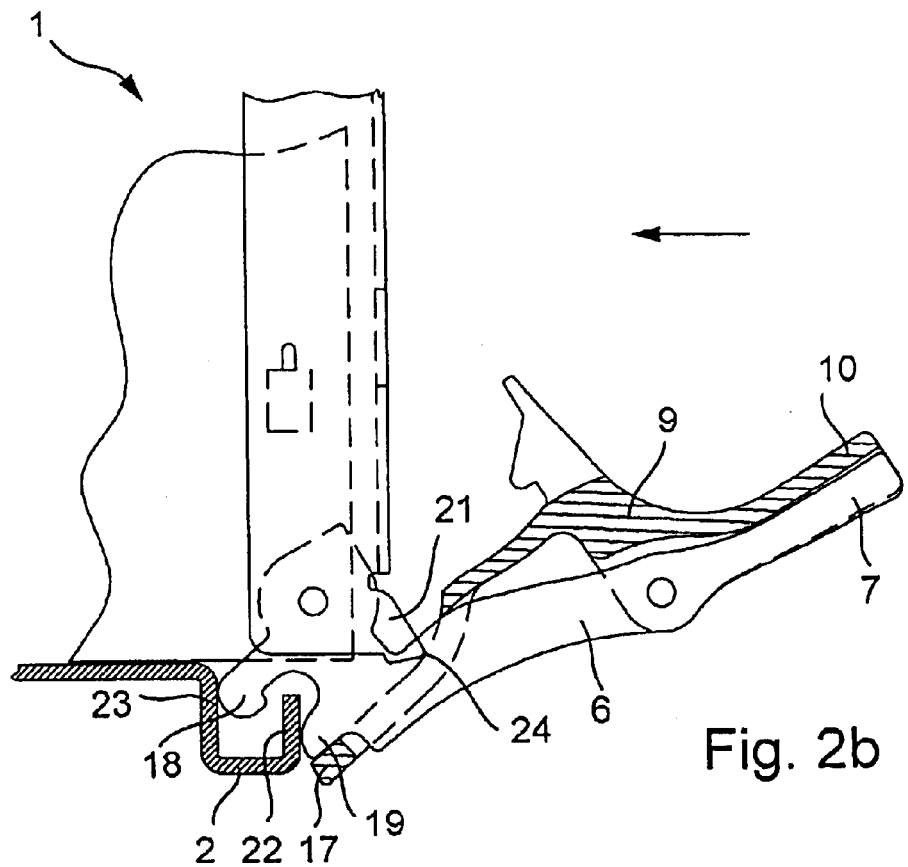

FIG. 2b shows the partially inserted plug-in module 1 with partially pivoted-in lever pull 6. The lever pull 6 is pivoted far enough, so that the pressing shoulder 19 engages in the outside leg 22 of the front stop edge 2. The locking lever 9 is returned to its rest position as a result of the elastic pre-tensioning.

Figure 2C:
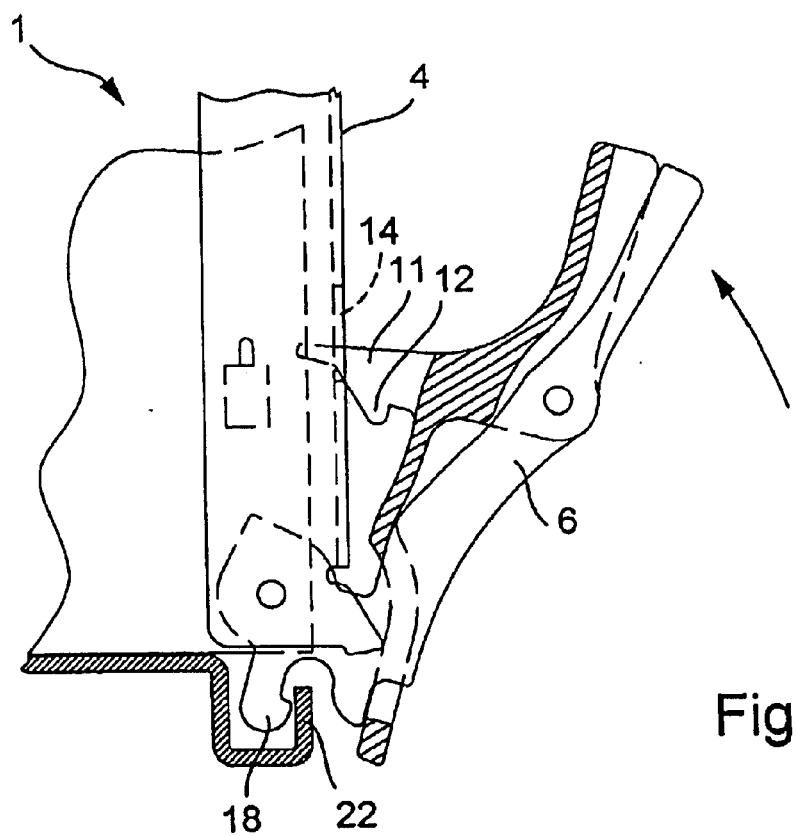

In FIG. 2c, the lever pull 6 is pivoted far enough so that the tail skid 18 acts upon the inside of the outside leg 22 and the plug-in module 1 can be inserted by lever into the rack. The detent 11 already partially engages in the recess 14 on the front panel 4 while the detent nose 12 is still located outside of the front panel 4.

Figure 2D:
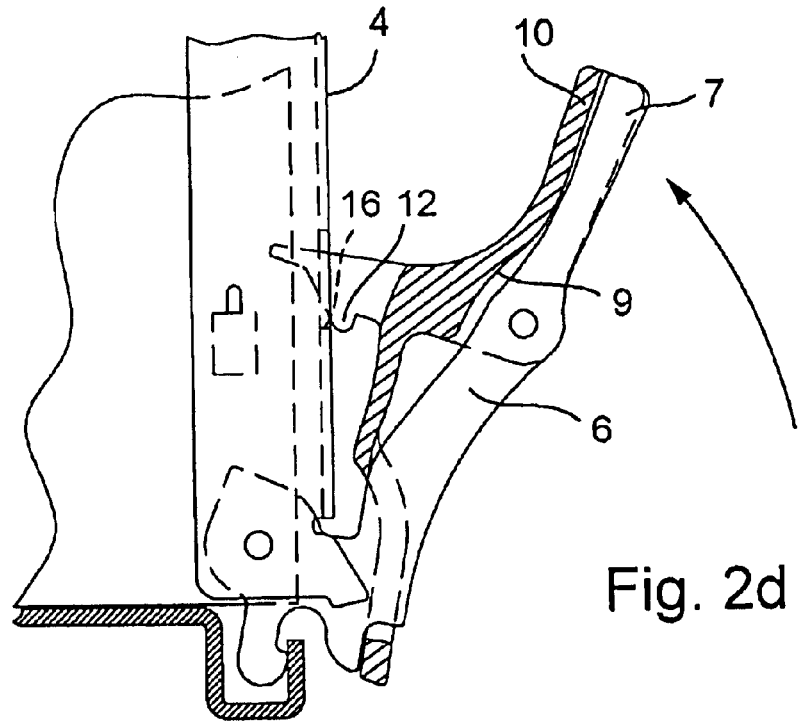

During a further pivoting of the lever pull 6, as shown in FIG. 2d, the detent nose 12 comes to rest against the detent edge 16 of front panel 4. As a result, the activation arm 10 of locking lever 9 is turned in the direction of handle arm 7 of the lever pull 6.

Figure 2E:
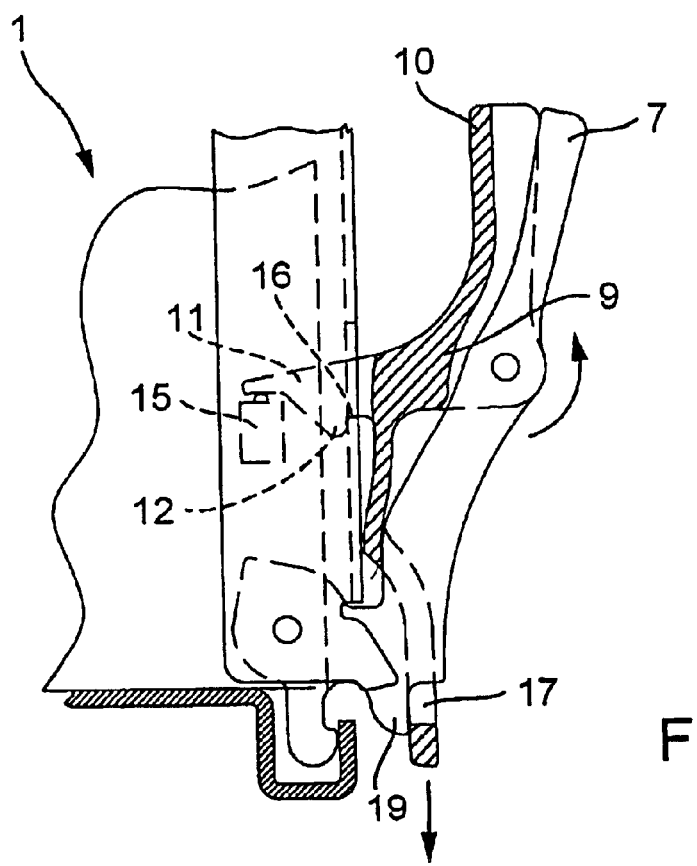

Once the plug-in module 1 is completely inserted into the rack, as shown in FIG. 2e, the detent nose 12 is latched-in behind the detent edge 16. With its exposed end, the detent 11 pushes onto the switch 15, thus switching the plug-in module 1 to the active state. The latching-in of detent nose 12 behind the detent edge 16 causes a rapid turning of the locking lever 9 back to the rest position where the activation arm 10 projects away from the handle arm 7. The plug-in module 1 is then completely inserted into the rack.

Figure 3:
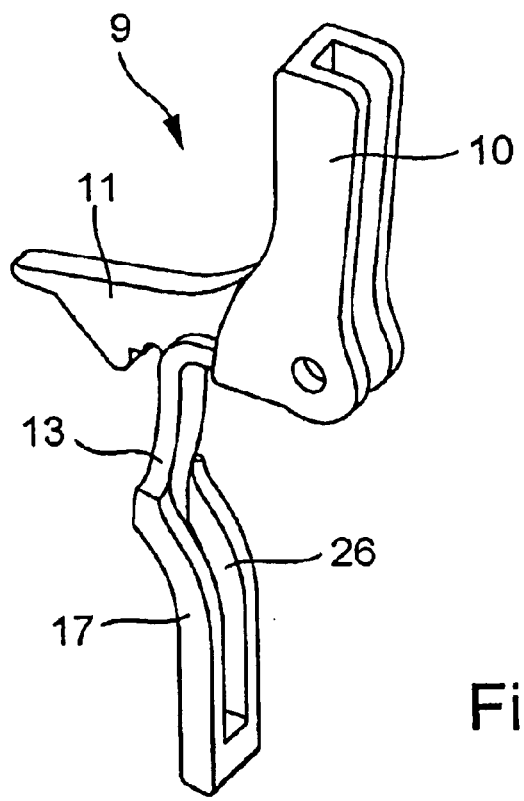

FIG. 3 provides a detailed illustration of the locking lever 9. The locking tab 13 of this embodiment is not arranged directly on the detent 11, but on the lower end of activation arm 10. The activation arm 10 has a U-shaped cross section, wherein the handle arm 7 of lever pull 6 (compare FIG. 4) can be pivoted-in between its two U-shaped legs. The activation element 17 is formed as an extension onto the locking tab 13. The activation element 17 is provided with a recess 26 through which the lever pull 6 can project at least in part. The U-shaped back of activation arm 10 is clearly wider than the handle arm 7 of lever pull 6.

Figure 4:
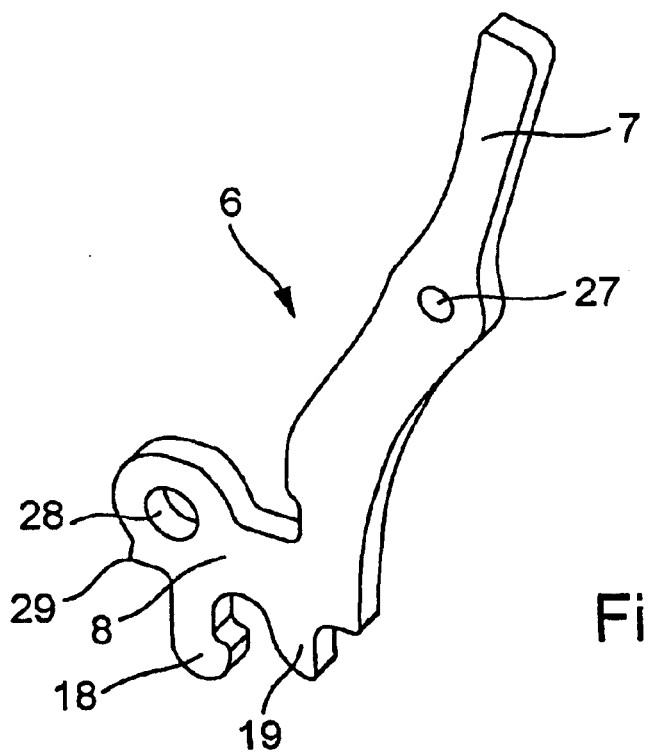

The lever pull 6 is shown separately in FIG. 4. The lever is provided approximately in the center of its handle arm 7 with a bore 27 which corresponds to the bores in the U-shaped legs of activation arm 10 of locking lever 9 (compare FIG. 3) and forms a pivot bearing jointly with these bores, so that the locking lever 9 is positioned pivoting on the lever pull 6. The lever arm 8 with tail skid 18 and pressing shoulder 19 furthermore has a bearing bore 28 which forms the pivot bearing for pivoting the lever pull 6 itself. An offset 29 is formed below the bearing bore 28 which, together with an end stop, limits the pivoting movement of lever pull 6.

Figure 5A:
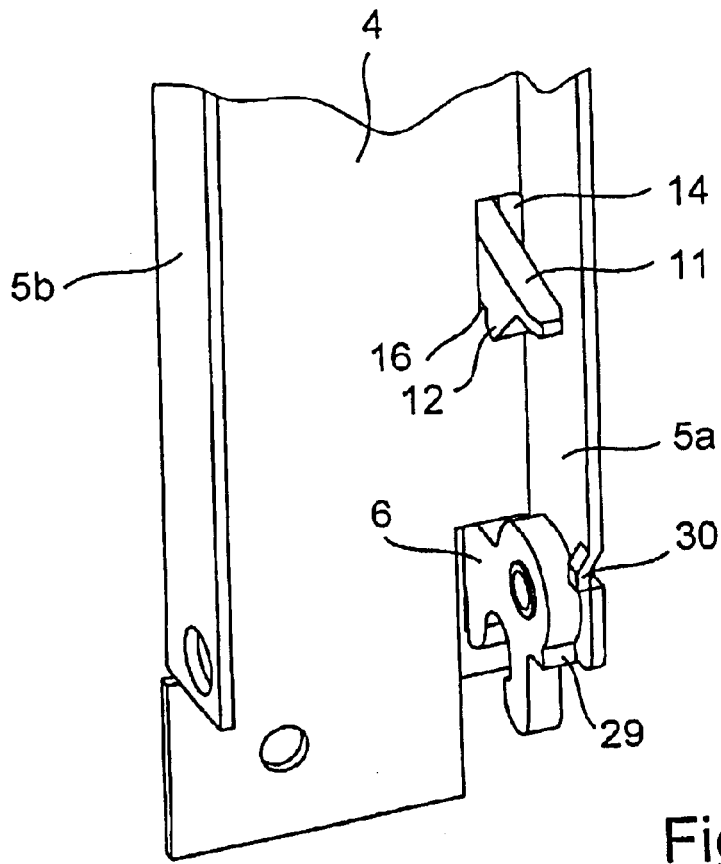

FIG. 5a shows the front panel 4 with its two side parts 5a, 5b as seen from the inside, meaning from the plug-in module 1, if the lever pull 6 is completely pivoted in. The detent 11 projects through the recess 14 while the detent nose 12 engages behind the detent edge 16. The lever pull 6 is positioned rotating at the lower end of the side part 5a. An end stop 30 is also formed in the lower region of side part 5a. If the lever pull 6 is completely pivoted out, the end stop 30 together with the offset 29 limits the angle of rotation for the lever pull 6 and thus determines the maximum position for pivoting out.

Figure 5B:
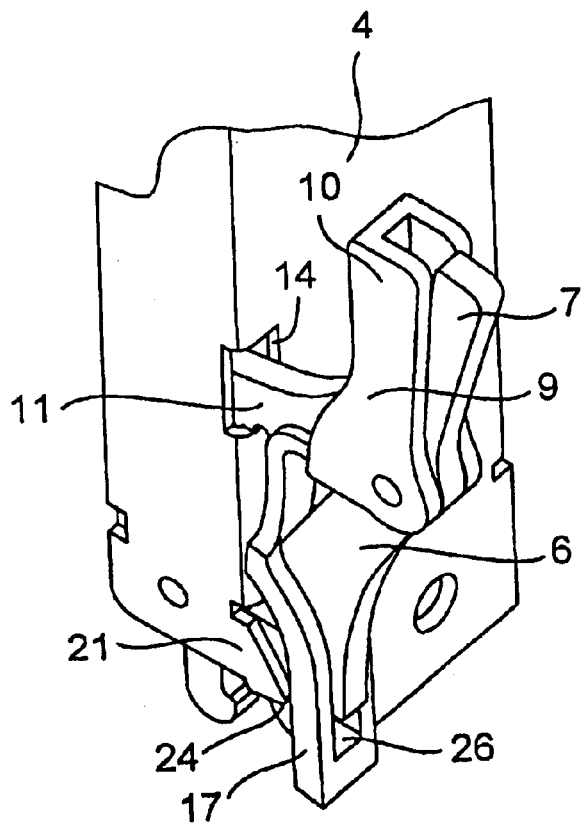

FIG. 5b shows the outside of front panel 4 with the lever pull 6 and the locking lever 9 mounted thereon. The activation arm 10 of locking lever 9 encircles with its U-shaped legs the handle arm 7 of the lever pull 6. The detent 11 projects through the recess 14 in the front panel 4. The lever pull 6 projects through the recess 26 in the activation element 17.

Figure 6A:
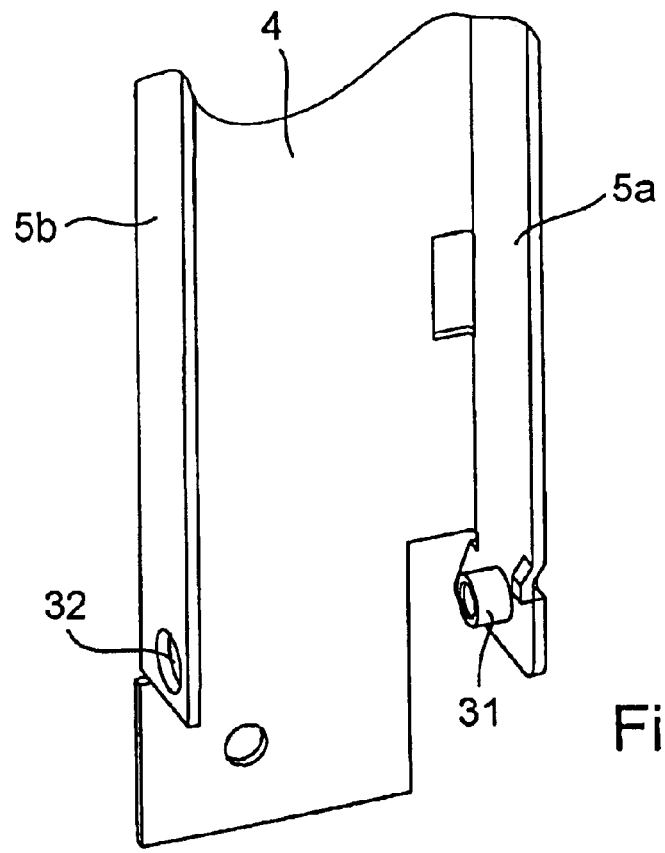
FIG. 6a The lower end of the front panel for the plug-in module shown in FIG. 5a, in a perspective representation from the inside.

FIG. 6a shows the front panel 4 from the inside, without the lever pull. A flange 31 for accommodating the lever pull is arranged at the lower end of the side part 5a. The flange 31 has an internal thread (not shown herein), so that the lever pull can be secured with a screw. In addition, the circuit board for the plug-in module can be attached to the flange 31. A bore 32 in the side part 5b of front panel 4 is aligned with the flange 31, such that a screw driver can be guided through the bore 32 and a screw can be screwed into the flange 31.

Figure 6B:
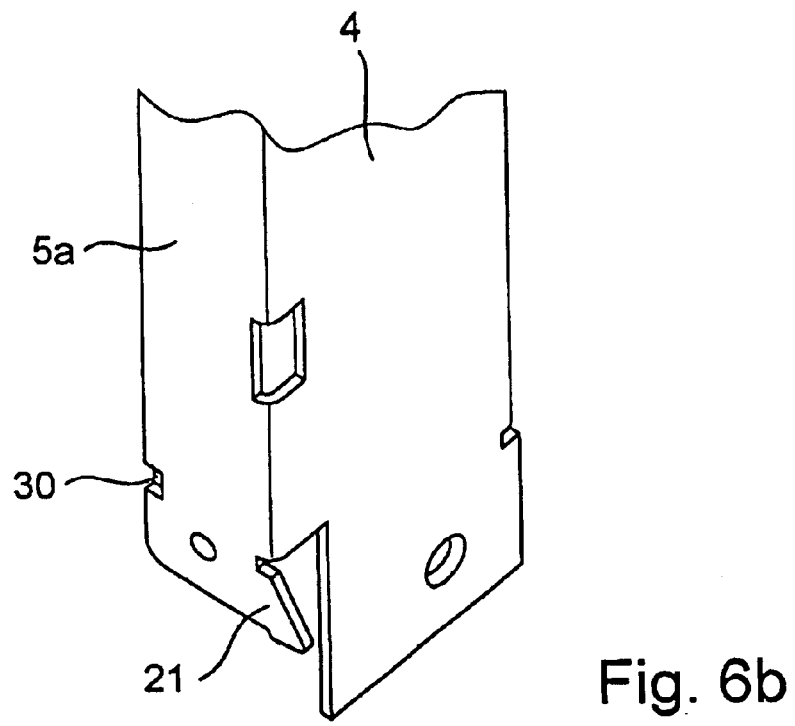
FIG. 6b The front panel in FIG. 6a, as seen from the outside.

FIG. 6b shows the front panel 4 from the front, wherein the locking profile 21 is formed onto the lower end of side part 5a. This locking profile projects over the front panel 4 toward the front. The end stop 30 that faces toward the inside can be seen at the rear edge of side part 5a. The front panel 4 with side parts 5a, 5b and the locking profile 21, designed in this way, can be produced as one piece by stamping it out and bending the side parts 5a, 5b.

FIG. 7a shows an alternative embodiment of the front panel 4. A corner piece 33 is attached with screw 34 to the front panel 4 in the lower region of front panel 4, wherein the corner piece 33 forms an extension of the side part 5a.

The inside of front panel 4 according to FIG. 7a is shown in FIG. 7b. The front panel 4 is provided with a sheet metal holder 35 that is bent at a 90° angle toward the inside. The sheet metal holder 35 contains a bore 36 with collar 37 formed around it. The bore 36 is provided with an internal thread (not shown herein), into which the screw that holds the corner piece 33 is screwed. The corner piece 33 encircles the lever arm 8 of lever pull 6. The bearing bore 28 in the lever arm 8 is aligned with the bore 36 in the sheet metal holder 35. The corner piece 33 and the lever arm 8 are positioned at a distance to the sheet metal holder 35, such that the circuit board for the plug-in module can be inserted into the space between them. The circuit board is then also held in place by the screw that holds the corner piece 33.

The front panel 4 according to FIG. 7a is shown by itself in FIG. 8a, wherein the side part 5a is shortened by the height of the sheet metal holder 35, thus offering space for holding the corner piece. The inside view is shown in FIG. 8b, which shows that the sheet metal holder 35 projects perpendicular toward the inside and is aligned parallel to the side parts 5a, 5b.

Figure 9A:
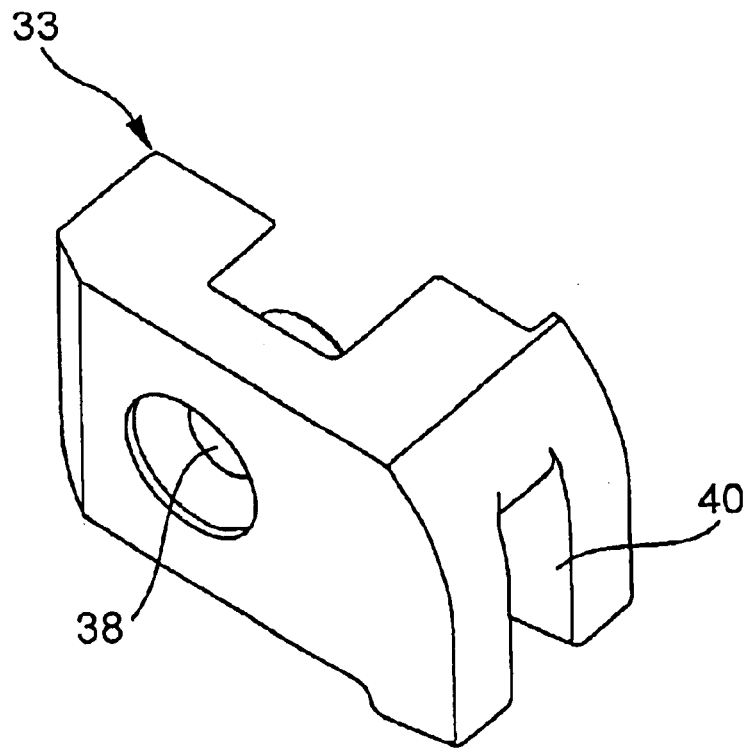
FIGS. 9a and 9b The corner piece shown in FIG. 7a, by itself.
Figure 9B:
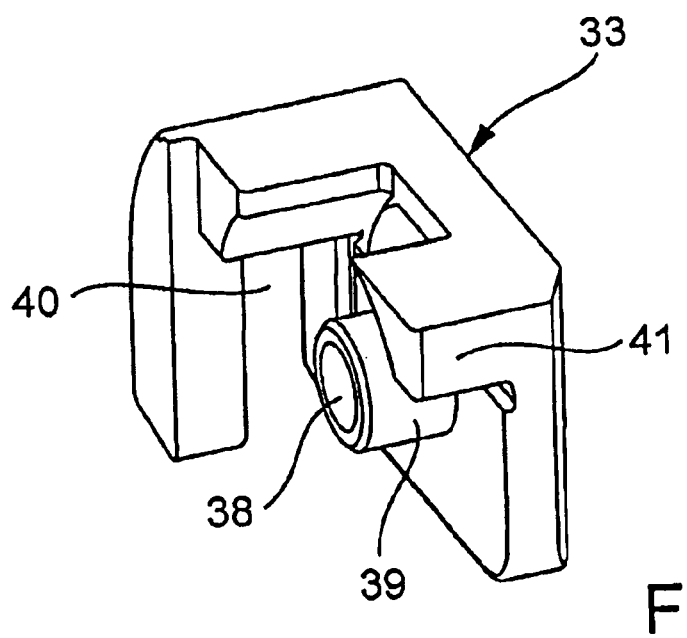

FIGS. 9a and 9b show a perspective representation of the corner piece 33. A bore 38 is arranged on the longitudinal side of the corner piece 33. The bore 38 projects through a bushing 39 on the inside of corner piece 33. The bushing 39 serves to accommodate the lever pull that is guided inside a groove 40. A stopper 41 that limits the maximum angle of rotation of the lever pull is formed onto the front, upper edge of the corner piece 33.

The invention has been described in detail with respect to exemplary embodiments, and it will now be apparent from the foregoing to those skilled in the art, that changes and modifications may be made without departing from the invention in its broader aspects, and the invention, therefore, as defined in the appended claims, is intended to cover all such changes and modifications that fall within the true spirit of the invention.

What is claimed is:

1. A plug-in module, designed to be inserted into and/or pulled out of a module rack provided with at least one front stop edge, comprising a lever pull with a handle arm and lever arm which is positioned pivoting in a frontal region of the plug-in module, the plug-in module comprising:

a locking lever is attached such that it can rotate on the handle arm of the lever pull;

the locking lever is provided with an elastic locking tab;

a corresponding locking profile is provided in the frontal region of the plug-in module and the locking tab engages behind the locking profile if the lever pull is completely pivoted out, thus preventing the lever pull from pivoting.

2. The plug-in module according to claim 1, wherein a face plate comprises an angled, essentially level side part with a corner region that is designed as locking profile.

3. The plug-in module according to claim 1, wherein a corner piece is provided in the corner region of a face plate on which the lever pull is positioned pivoting and on which the locking profile is formed.

4. The plug-in module according to claim 1, wherein the locking lever comprises a detent for locking in place the completely pivoted-in lever pull and the locking tab is attached to the detent.

5. The plug-in module according to claim 4, wherein the detent activates a switch for the active/passive switching of the plug-in module once the plug-in module is completely inserted.

6. The plug-in module according to claim 4, wherein the detent is provided with a detent nose which can be made to engage behind a detent edge in the frontal region of the plug-in module.

7. The plug-in module according to claim 6, further comprising:

a face plate with recess which forms the detent edge and through which the detent projects.

8. The plug-in module according to claim 1, further comprising:

an activation element that operates jointly with the front stop edge of the module rack acts upon the locking tab, such that the lever pull is automatically unlocked during the insertion of the plug-in module.

9. The plug-in module according to claim 8, wherein the activation element is embodied as extension of the locking tab and rests with pre-tensioning against the lever arm of the lever pull.

10. The plug-in module according to claim 8, wherein the activation element is positioned on the lever arm, such that it can be displaced in longitudinal direction.

11. The plug-in module according to claim 1, wherein the locking lever comprises an activation arm.

12. The plug-in module according to claim 11, wherein the activation arm has a U-shaped cross section and that the handle arm of lever pull can be pivoted between its U-shaped legs.

13. A plug-in module for insertion into and removal from a module rack, the module rack having a face plate, a locking profile and a front stop edge, the plug-in module comprising:

a lever pull, including
a handle arm; and
a lever arm attached to the plug-in module for rotation from an inward position when the plug-in module is inserted in the module rack to an outward position when the plug-in module is removed from the module rack, said lever arm having a pressing shoulder and a tail skid, said tail skid engaging the front stop edge when the plug-in module is inserted in the module rack; and a locking lever including
an activation arm rotatably attached to the handle arm of said lever pull;
a detent extending approximately perpendicular to said activation arm, said detent projecting through a recess in the face plate when the plug-in module is inserted in the module rack;
a locking tab extending from said detent approximately parallel to said lever pull, said locking tab engaging the locking profile when the plug-in module is removed from the module rack thereby preventing said lever pull from pivoting beyond said outward position; and an activation element extending from said locking tab toward said lever arm, said activation element pressing against said pressing shoulder when the plug-in module is inserted in the module rack.

14. The plug-in module according to claim 13, wherein the locking tab is an elastic locking tab.

15. A plug-in module for insertion into and removal from a module rack, the module rack having a locking profile, a front stop edge, and a face plate, the plug-in module comprising:

a lever pull including
a handle arm; and
a lever arm attached to the plug-in module for rotation from an inward position when the plug-in module is inserted in the module rack to an outward position when the plug-in module is removed from the module rack; and a locking lever including
an activation arm rotatably attached to the handle arm of said lever pull; and
a locking tab engaging the locking profile when the plug-in module is removed from the module rack thereby preventing said lever pull from pivoting beyond said outward position.

16. The plug-in module according to claim 15, wherein the locking tab is an elastic locking tab.

17. The plug-in module according to claim 15, further comprising:

a detent extending approximately perpendicular to said activation arm, said detent projecting through a recess in the face plate when the plug-in module is inserted in the module rack.

18. The plug-in module according to claim 15, wherein said locking tab extends approximately parallel to said lever pull.

19. The plug-in module according to claim 15, said lever arm further comprising:

a pressing shoulder; and
a tail skid for engaging the front stop edge when the plug-in module is inserted in the module rack.

20. The plug-in module according to claim 19, further comprising:

an activation element extending from said locking tab toward said lever arm, said activation element pressing against said pressing shoulder when the plug-in module is inserted in the module rack.

* * * * *